US005882959A

United States Patent [19]
Kadosh et al.

[11] Patent Number: 5,882,959
[45] Date of Patent: Mar. 16, 1999

[54] MULTI-LEVEL TRANSISTOR FABRICATION METHOD HAVING AN INVERTED, UPPER LEVEL TRANSISTOR WHICH SHARES A GATE CONDUCTOR WITH A NON-INVERTED, LOWER LEVEL TRANSISTOR

[75] Inventors: Daniel Kadosh, Austin; Mark I. Gardner, Cedar Creek, both of Tex.

[73] Assignee: Advanced Micro Devices, Inc.

[21] Appl. No.: 729,810

[22] Filed: Oct. 8, 1996

[51] Int. Cl.[6] .................... H01L 21/00

[52] U.S. Cl. .................... 438/152; 438/303; 438/618; 438/238; 438/585; 438/586; 438/588

[58] Field of Search .................... 438/152, 238, 438/303, 585–589, 592–593, 618

[56] References Cited

U.S. PATENT DOCUMENTS

| | | | |
|---|---|---|---|
| 4,902,637 | 2/1990 | Kondou | 438/152 |
| 5,424,235 | 6/1995 | Nishihara | 438/152 |
| 5,714,394 | 2/1998 | Kadosh et al. | 438/152 |
| 5,731,217 | 3/1998 | Kadosh et al. | 438/152 |
| 5,747,367 | 5/1998 | Kodosh et al. | 438/152 |
| 5,770,482 | 6/1998 | Kadosh et al. | 438/152 |
| 5,770,483 | 6/1998 | Kodosh et al. | 438/152 |

*Primary Examiner*—John F. Niebling
*Assistant Examiner*—Lynne A. Gurley
*Attorney, Agent, or Firm*—Kevin L. Daffer; Conley, Rose & Tayon

[57] ABSTRACT

A process is provided for producing active and passive devices on various levels of a semiconductor topography. As such, the present process can achieve device formation in three dimensions to enhance the overall density at which an integrated circuit is formed. The multi-level fabrication process not only adds to the overall circuit density but does so with emphasis placed on interconnection between devices on separate levels. Thus, high performance interconnect is introduced whereby the interconnect is made as short as possible between features within one transistor level to features within another transistor level. The interconnect achieves lower resistivity and capacitance by forming a single gate conductor which is shared by an upper level transistor and a lower level transistor. The shared gate conductor is interposed between a pair of gate dielectrics and each gate dielectric is configured between the single gate conductor and a respective substrate. Thus, the upper level transistor is inverted relative to the lower level transistor. The upper level transistor includes a substrate and junction region formed within and opening of an interlevel dielectric. The opening serves to receive the substrate material, but also to demarcate the formation of a pre-existing gate dielectric prior to substrate deposition. Sharing a single gate conductor among two transistors not only minimizes the overall routing between transistor inputs, but also is particularly attuned to inverter formation.

14 Claims, 3 Drawing Sheets

48
46b
50
50
52
42b
38
14
20
22
32
28
28
10

MULTI-LEVEL TRANSISTOR FABRICATION METHOD HAVING AN INVERTED, UPPER LEVEL TRANSISTOR WHICH SHARES A GATE CONDUCTOR WITH A NON-INVERTED, LOWER LEVEL TRANSISTOR

BACKGROUND

1. Field of the Invention

This invention relates to integrated circuit manufacture and more particularly to multi-level transistor fabrication and high performance interconnect arranged therebetween.

2. Description of the Relevant Art

The structure and the various components, or features, of a metal oxide semiconductor ("MOS") are generally well known. A MOS transistor typically comprises a substrate material onto which a patterned gate conductor is formed. The gate conductor serves to self-align impurities forwarded into the substrate on opposite sides of the gate conductor. The impurities placed into the substrate define a junction region, also known as source/drain regions. The gate conductor is patterned from a layer of polysilicon using various lithography techniques.

A typical n-channel MOS transistor employs n-type junctions placed into a p-type substrate. Conversely, a typical p-channel MOS transistor comprises p-type junctions placed into an n-type substrate. The substrate comprises an entire monolithic silicon wafer, of which a portion of the substrate known as a "well" exists. The well is doped opposite the substrate so that it can accommodate junctions of an impurity type opposite the junction in the non-well areas. Accordingly, wells are often employed when both n-type and p-type transistors (i.e., CMOS) are needed.

A pervasive trend in modern integrated circuit manufacture is to produce transistors having feature sizes as small as possible. To achieve a high density integrated circuit, features such as the gate conductor, source/drain junctions, and interconnect to the junctions must be as small as possible. Many modem day processes employ features which have less than 1.0 μm critical dimension. As feature size decreases, the resulting transistor as well as the interconnect between transistors also decreases. Smaller transistors allows more transistors to be placed on a single monolithic substrate, thereby allowing relatively large circuit systems to be incorporated on a single, relatively small die area.

The benefits of high density circuits can only be realized if advanced processing techniques are used. For example, semiconductor process engineers and researchers often study the benefits of electron beam lithography and x-ray lithography to achieve the lower resolutions needed for sub-micron features. To some extent wet etch has given way to a more advanced anisotropic (dry etch) technique. Further, silicides and polycides have replaced higher resistivity contact structures mostly due to the lower resistivity needed when a smaller contact area is encountered.

There are many numerous other techniques used to achieve a higher density circuit, however, these techniques as well as others still must contend with problems resulting from higher density itself. Even the most advanced processing techniques cannot in all instances offset the problems associated with small features or features arranged extremely close to one another. For example, as the channel length decreases, short channel effects ("SCE") generally occur. SCE cause threshold voltage skews at the channel edges as well as excessive subthreshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric field can give rise to so called hot carriers and the injection of those carriers into the gate oxide which resides between the substrate (or well) and the overlying gate conductor. Injection of hot carriers should be avoided since those carriers can become trapped and skew the turn-on voltage of the ensuing transistor.

It appears as though even the most advanced processing techniques cannot avoid in all instances the problems which arise as a result of high density fabrication. As features are shrunk and are drawn closer together across a single topological surface, the closeness of those features causes numerous problems even under the most advanced processing conditions. It therefore appears that there may be a certain limitation beyond which feature sizes cannot be reduced if those features are to reside on the single elevational level. It would therefor be desirable to derive a processing technique which can produce features on more than one level. That is, it would be beneficial that this multi-level processing technique produce both active (transistors) and passive (capacitors and resistors) in three dimensions so as to enhance the overall circuit density without incurring harmful side effects associated with feature shrinkage and closeness.

Before a multi-level transistor fabrication process can be introduced, however, that process must pay careful attention to the interconnection between the transistors placed on separate levels. Therefore, it is desirable to derive an interconnect scheme which can connect various features on one elevation (topological) level to features on another level. That interconnection must be as short as possible in order to minimize resistance in critical routing conductors. The desired fabrication process must therefore incorporate not only multi-level fabrication but also high performance interconnect routing as an essential part of that process. For example, it would be desirable to incorporate a relatively short interconnect between inputs to a pair of transistors. An inverter arrangement might be one example in which inputs are forwarded to a pair of transistors. High performance interconnection of those inputs implies that the resistance and capacitance be as small as possible to lessen the load seen by the upstream circuit. Without a mechanism to achieve high speed interconnection, multi-level fabrication is limited in its application.

SUMMARY OF THE INVENTION

The problems outlined above are in large part solved by a multi-level transistor fabrication technique. The present technique can produce one or more active and passive devices on a first level, followed by one or more active and passive devices on a second level. The first level is substantially planar and extends across an entire wafer surface. The second level is also substantially planar and parallel to the first level, but spaced by a dielectric therefrom.

According to a preferred embodiment, a first transistor is formed on the first level and a second transistor is formed on the second level. The first and second transistors each share a single gate conductor which is spaced from respective substrates (or wells) by a gate dielectric. The single gate conductor is thereby dieletrically interposed between channel regions of the first and second transistors. The first transistor comprises a patterned gate conductor and, if desired, spacers formed on the side wall of that conductor. The gate conductor provides self-alignment of lightly doped drain ("LDD") implants into a substrate which resides beneath the patterned gate conductor. The substrate contains pre-existing dopants which are of the opposite impurity type than the junctions formed therein. If a spacer is to be used, the spacer allows spaced introduction of source/drain junctions from the pre-existing LDD implant. Both the LDD and the source/drain implants are of an impurity type opposite the substrate.

An interlevel dielectric is formed across the lower level substrate (i.e., first level substrate or first substrate) as well as across the first transistor which resides upon and within a portion of the first substrate. The interlevel dielectric is purposely removed in a region directly above the first transistor gate conductor. As such, the exposed gate conductor upper surface can receive a gate dielectric. The gate dielectric can be deposited or grown. It is grown if the gate conductor contains silicon, such as would be the case if the gate conductor is polycrystalline silicon ("polysilicon").

Production of a gate dielectric upon a gate conductor thereby presents a gate conductor interposed at a elevation level between the upper gate dielectric and the pre-existing lower gate dielectric. This sandwiched configuration and pre-existing opening to the upper gate dielectric allows subsequent deposition of a substrate material within the opening. The substrate material is henceforth referred to as the second substrate in that it is configured at a second elevation level above the first elevation level at which the first substrate resides. The second substrate is preferably polysilicon deposited across the interlevel dielectric and into the opening. The deposited polysilicon is then removed from the upper surfaces of the interlevel dielectric to form the second substrate entirely within the confines of the opening.

A masking layer is then deposited across the interlevel dielectric and removed from all regions except a center portion along the recessed, second substrate. The masking material, preferably a spin on material such as photoresist, blocks ions from being implanted into a central portion. The central portion is defined as a channel of a second transistor, and the portions which receive implant are defined as junctions of that transistor. Thus, the second transistor shares the gate conductor of the first transistor. Instead of having the junctions reside beneath and laterally spaced from the gate conductor, as in the first transistor, the second transistor comprises junctions placed above the gate conductor. Thus, the second transistor is inverted relative to the first transistor. Further, the second transistor comprises junction profiles which extend laterally outward as they approach the second transistor gate dielectric. This is contrary to the first transistor junction profiles which extend inward as they approach the first transistor gate dielectric. The difference injunction profiles (i.e. junction boundaries) is due to the nature in which the second transistor is inverted relative to the first transistor.

It is inherent from the present process that the gate conductor can be doped similar to the junctions of the first transistor during the time in which those junctions are formed using the self-aligned process. However, the junctions of the second transistor are doped opposite the junctions of the first transistor. The shared gate conductor may therefore have an impurity opposite the junctions of the second transistor. However, this does not deleteriously affect second transistor operation. The differing operating characteristics of the first and second transistors as a result of the present formation can be compensated in the manner in which, for example, the second substrate is doped. It is therefore implicit in the present method that the substrate material placed within the opening and upon the second transistor gate dielectric is doped prior to formation of junctions therein. The dopant concentration within the second substrate is of an impurity type opposite the second transistor junctions. That impurity type, and specifically the concentration of that impurity, can be modified to take into account a gate conductor of preferably opposite impurity to the junctions of the second transistor.

Accordingly, the first transistor is an n-channel transistor and the second transistor is a p-channel transistor, or vice versa. In the former instance, the shared gate conductor, is n-type and in the latter instance the shared conductor is p-type. Coupling a pair of opposed polarity transistors with a single gate conductor allows formation of an inverter with minimal load at the inverter input.

BRIEF DESCRIPTION OF THE DRAWINGS

Other objects and advantages of the invention will become apparent upon reading the following detailed description and upon reference to the accompanying drawings in which.

Figure 1:
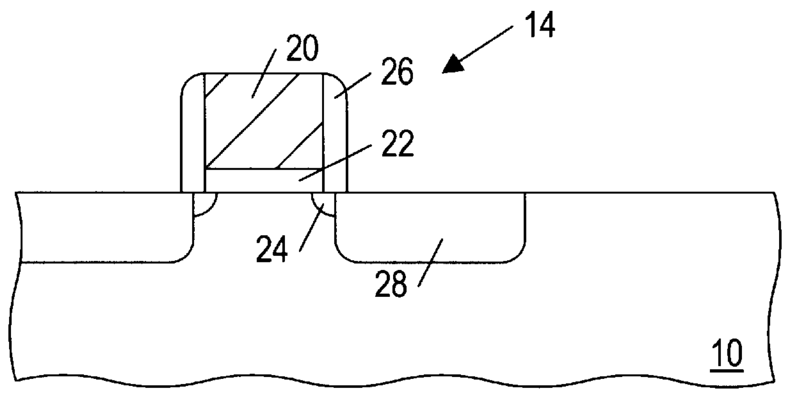
FIG. 1 is a partial cross-sectional view of a semiconductor topography having a first transistor formed upon and within the semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a partial cross-sectional view of a semiconductor substrate 10. Substrate 10 is preferably a silicon-based, single crystalline material doped either n-type or p-type. Arranged on the upper surface of substrate 10 can be various isolation structures (not shown). Isolation structures can be formed either by the shallow trench process or the LOCOS process. In either event, isolation structures serve to isolate an active or passive device in one portion of substrate 10 from an active or passive device within another portion of substrate 10.

An example of one active device formed between isolation structures is provided in reference to numeral 14. Device 14 is shown as a first transistor formed upon and within the upper surface of substrate 10. First transistor 14 includes, according to one embodiment, a gate conductor 20 and a gate dielectric 22. Gate conductor 20, in combination with adjacent isolation structures, serve to mask implant of a lightly doped drain 24 ("LDD") into the regions therebetween. Thereafter, a CVD oxide is deposited across the topography, including the LDD implant areas 24. The CVD oxide is then removed using an anisotropic etch. Resulting from the anisotropic etch, oxide spacers 26 remain on opposing side wall surfaces of conductor 20. Spacers 26, as well as isolation structures 12, serve to mask implant of source/drain impurities. The source/drain implant 28, in conjunction with LDD implant 24, comprises a junction, wherein the term "junction" connotes either a source region or a drain region.

Figure 2:
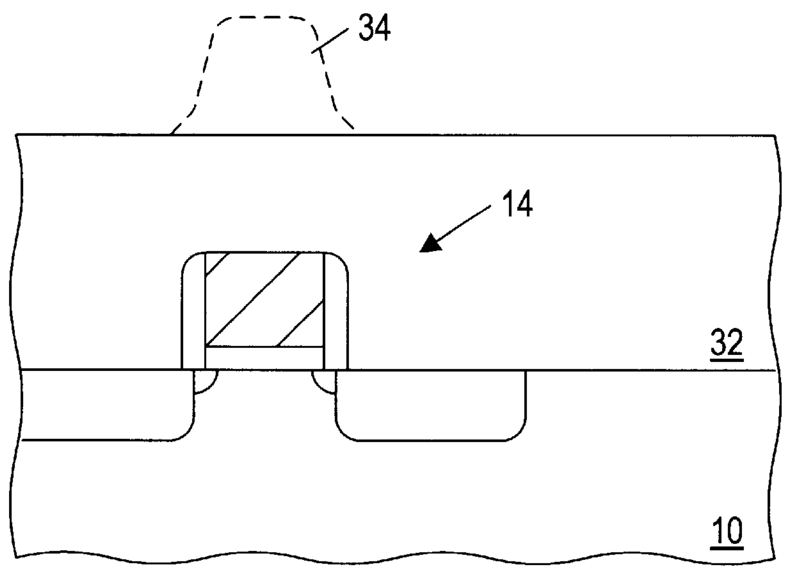
FIG. 2 is a partial cross-sectional view of the semiconductor topography having an interlevel dielectric formed across the first transistor as well as the semiconductor substrate laterally adjacent the first transistor according to a processing step subsequent to FIG. 1.

Referring to FIG. 2, a processing step subsequent to FIG. I is shown. In particular, FIG. 2 illustrates an interlevel dielectric 32 deposited across the first topography onto which and into which the first transistor 14 resides. Interlevel dielectric 32 can be deposited in numerous ways. Preferably, dielectric 32 is deposited as an oxide using chemical vapor deposition (CVD) techniques. According to one embodiment, dielectric 32 is deposited using plasma enhanced CVD to a thickness sufficient to isolate transistor 14 from certain devices subsequently placed upon and within dielectric 32.

In preparation for second level devices, peak elevation regions 34 of dielectric 32 are removed by chemical mechanical polishing ("CMP"). CMP utilizes a slurry material and a polishing pad placed on the exposed surface, whereby the pad rotates and removes the upper surfaces commensurate with the lower surfaces. According to another embodiment, the upper surfaces 34 are removed using a sacrificial etch back. In this instance, a sacrificial material is placed on the upper surface such that the recesses or valleys are filled with that material. The material upper surface is then removed at an etch rate substantially the same as the dielectric underlayer. When all of the sacrificial material is removed, the remaining dielectric surface is approximately planar in that it takes on the same contours as the planar surface of the sacrificial material.

Figure 3:
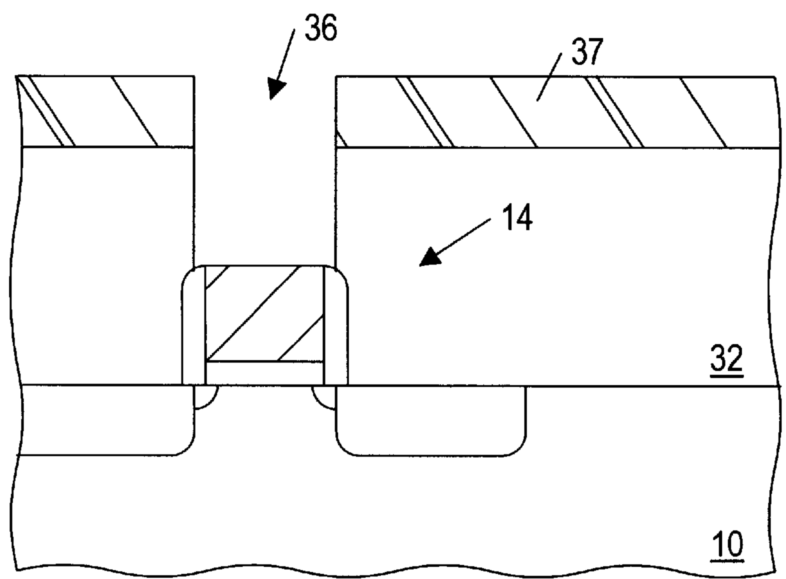
FIG. 3 is a partial cross-sectional view of the semiconductor topography having a portion of a masking material and underlying interlevel dielectric removed according to a processing step subsequent to FIG. 2.

Referring to FIG. 3, a processing step subsequent to FIG. 2 is shown. FIG. 3 depicts an opening 36 which extends entirely through interlevel dielectric 32 to the upper surface of gate conductor 20. Opening 36 is contained only to gate conductor 20 upper surface. Opening 36 is produced by placing a masking layer 37 across dielectric 32 and then removing portions of the masking layer such that the region to be opened is exposed. The exposed region is then subjected to an etch which, according to one embodiment, is a dry (anisotropic) etchant.

The etchant cycle continues for a time sufficient to remove all of interlevel dielectric 32 directly above gate conductor 20. The etchant composition is chosen so that it is selective to removing dielectric 32 instead of gate conductor 20. Thus, the etchant composition is selective to oxide as opposed to polysilicon, where polysilicon is the preferred composition of gate conductor 20. Various etchant species used for achieving that purpose are generally well known, all of which achieve a fairly straight side wall surface characteristic of an anisotropic etch.

Figure 4:
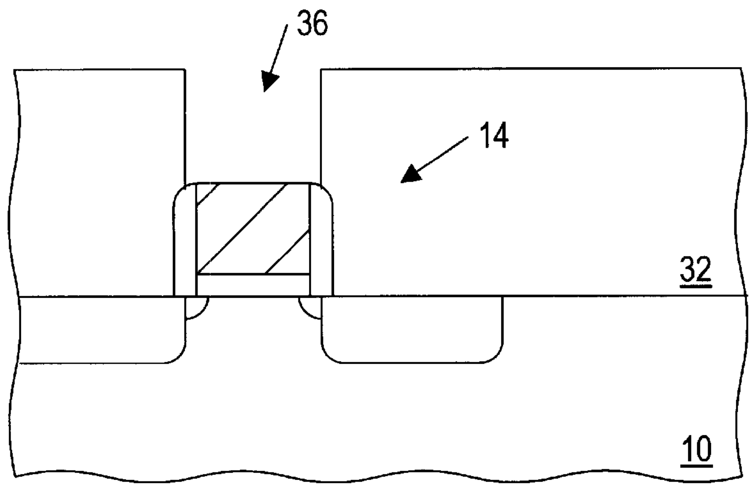
FIG. 4 is a partial cross-sectional view of the semiconductor topography having the masking material completely removed according to a processing step subsequent to FIG. 3.

Referring to FIG. 4, masking material 37 is removed entirely from dielectric 32 leaving opening 36 intact. Strip removal a masking material 37, such as photoresist is generally well known. The etchant used for this purpose is typically a wet etchant which is highly selective to photoresist as opposed to oxide or polysilicon.

Figure 5:
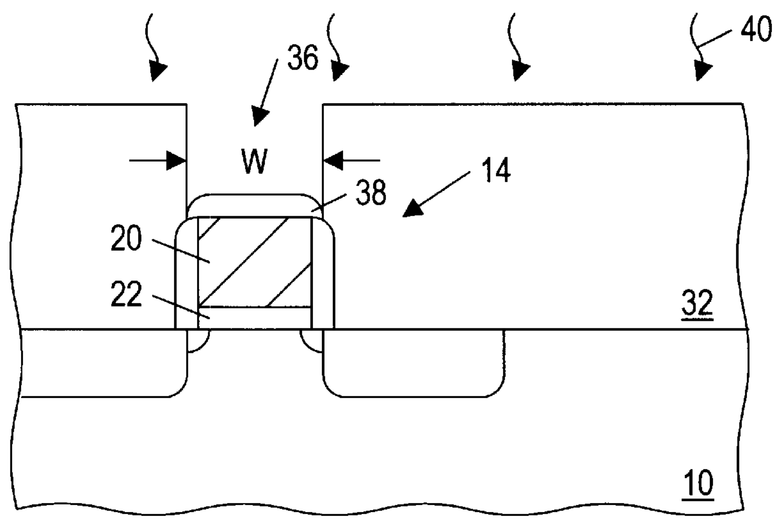
FIG. 5 is a partial cross-sectional view of the semiconductor topography having a gate dielectric formed upon the gate conductor of the first transistor according to a processing step subsequent to FIG. 4.

FIG. 5 illustrates a processing step subsequent to FIG. 4, wherein a gate dielectric 38 is formed upon the exposed surface of gate conductor 20. It is important that gate dielectric 38 occur, and it is equally important that opening 36 be large enough to encompass the entire width of gate conductor 20 at least in the area in which a second transistor substrate is to formed. Thus, width W is equal to or greater than the width of gate conductor 20. Moreover, the center line of opening 36 exists directly above the center line of gate conductor 20. According to one embodiment, gate dielectric 36 is grown upon the upper surface of gate conductor 20. Gate conductor 20, preferably being polysilicon, contains sufficient silicon atoms to react with oxygen applied during a thermal cycle 40 to form thermal oxide. Growth of thermal oxide at gate dielectric 38 is therefore similar to grown oxide at gate dielectric 22. Because of its dielectric properties, a grown gate dielectric is preferred over a deposited gate dielectric.

Figure 6:
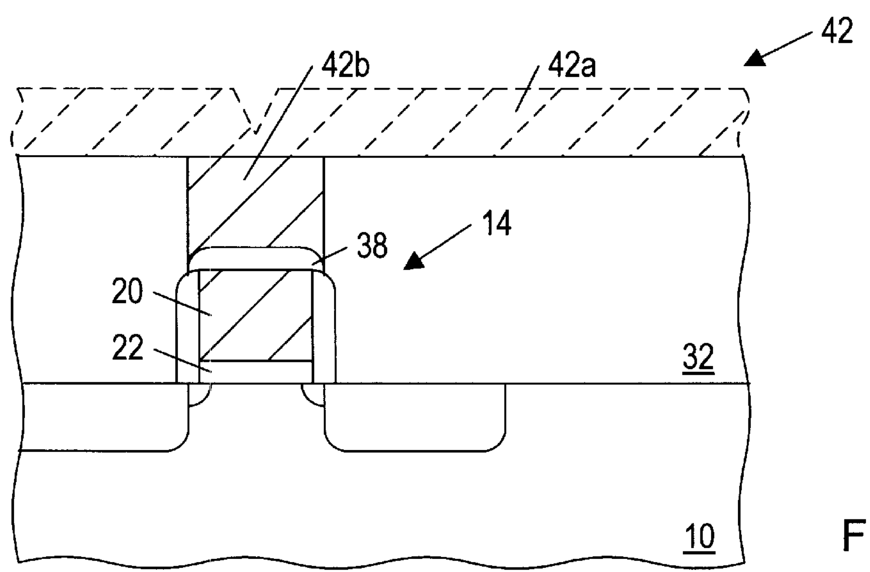
FIG. 6 is a partial cross-sectional view of the semiconductor topography having a second substrate formed substantially exclusively within the opening and upon the gate dielectric according to processing step subsequent to FIG. 5.

FIG. 6 illustrates deposition of substrate material 42 across the upper surface of dielectric 32. Substrate material 42 is deposited to a thickness sufficient to fill opening 36. Thereafter, substrate material 42 is removed in regions **42*a* from the upper surface of dielectric 32. Substrate material 42, however, is retained in regions 42*b* only within opening 36. Retained substrate material 42*b* is henceforth referred to as a second transistor substrate, or second substrate. The preferred substrate material is polysilicon. Substrate 42*b* is dielectrically spaced from gate conductor 20 by gate dielectric 38. Implicit in the formation of substrate 42*b* are dopants placed throughout the substrate material either before or after regions 42*a* are removed. Optionally, threshold adjust and/or punchthrough implants may be performed. Those dopants render substrate 42*b* conductive. More importantly, those dopants render substrate 42*b* semiconductive when junctions are subsequently placed therein. Those junctions being doped opposite the doping of substrate 42*b***.

Figure 7:
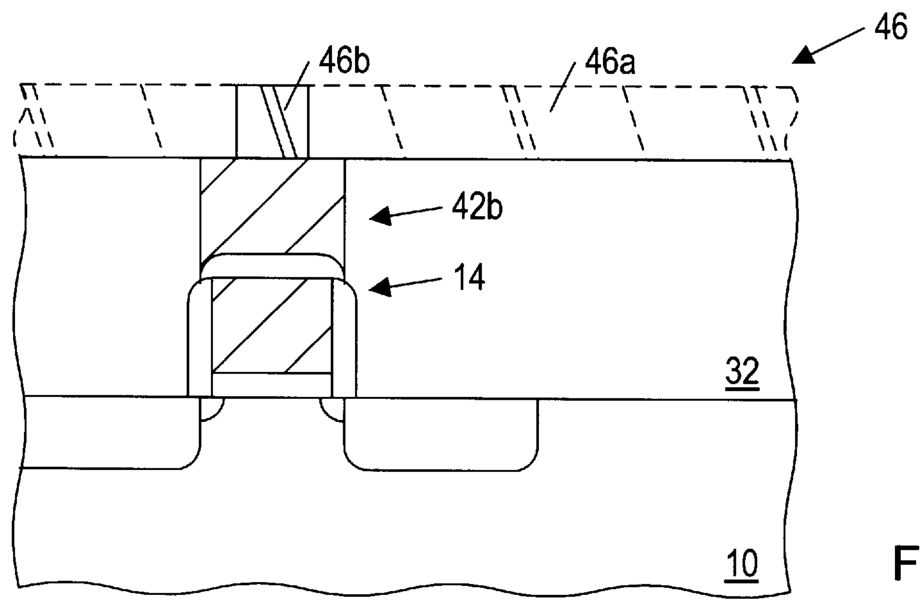
FIG. 7 is a partial cross-sectional view of the semiconductor topography having a masking material patterned upon a central portion of the second substrate according to a processing step subsequent to FIG. 6.

FIG. 7 depicts a processing step necessary to perform junction implant. Namely, FIG. 7 depicts a layer of masking material 46 deposited across dielectric 32 as well as substrate **42*b*. Since substrate 42*b* is recessed within dielectric 32, and has an upper surface commensurate with the upper surface of dielectric 32, deposition of masking material 46 to a uniform thickness is readily achievable. Masking material 46 applied to a relatively planar upper surface ensures uniform distribution but, more importantly, allows a more precise exposure and removal of the masking material. FIG. 7 illustrates masking material removed in regions 46*a* and retained in regions 46*b*. Removal of masking material can be achieved either by a wet or dry etch process depending upon the composition of that material. According to one embodiment, masking material 46** comprises photoresist which is spin-on deposited, cured and then removed according to well known photoresist patterning techniques.

Retained masking material **46*b* serves to block (or mask) implants forwarded into substrate 42*b***. Masking material 46*b* resides along a plane which is parallel to the plane along which substrate 42*b* extends. Material 46*b* extends for only a portion of the length of substrate 42*b*. Thusly placed masking material 46*b* allows source/drain implants 48 to be forwarded into regions near the outer periphery of substrate 42*b*. Those regions are often denoted as source/drain junction regions and are denoted as reference numeral 50. Source/drain region 50, in combination with substrate 42*b*, gate dielectric 38 and shared gate conductor 20 thereby form a second transistor 52. Second transistor is similar to first transistor except that it is inverted relative to the first transistor and shares the same gate conductor 20 as first transistor 14.

Figure 8:
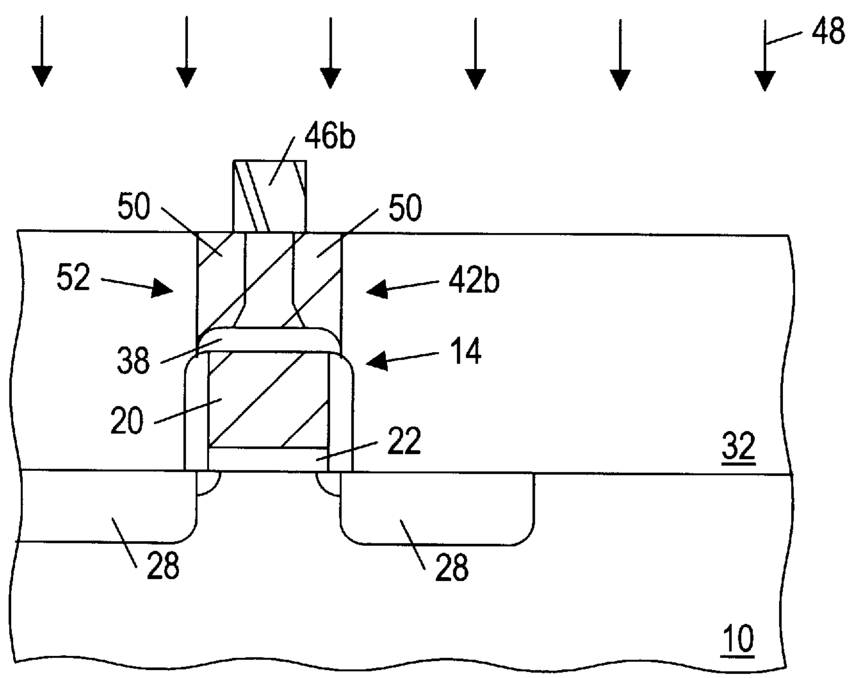
FIG. 8 is a partial cross-sectional view of the semiconductor topography having implant species forwarded into the second substrate in regions void of the masking material to conclude formation of a second transistor according processing step subsequent to FIG. 7.

Masking material 46*b* is thereafter removed in a processing step subsequent to that shown in FIG. 8. Various interconnect can be drawn to and contacted with source/drain regions 50 of second transistor 52 similar to contacts drawn to source/drain regions 28 of first transistor 14. The mechanism for making those connections are generally well known in the field of interconnect or contact technology. By forming openings and filling those openings with metal plugs, high density interconnect with minimal contact resistance can be achieved. Connection to the shared gate conductor 20 can also be performed by dropping contacts (or plugs) through interlevel dielectric level 42 either in front of or in back of the cross-sectional plane shown in FIG. 8. Typically, contact to a gate conductor of a transistor is performed outside the channel area, as would be the case in the present fabrication sequence.

For sake of clarity, the various features of first and second transistors 14 and 52, respectively, are not drawn to scale. Likewise, the topological thickness and area occupied by interlevel dielectric 32 and substrate 42*b* can be adjusted depending upon the size of transistors 14 and 52. It is not imperative that the relative features be drawn to scale or that dimensions be specified, all of which would be readily apparent to those skilled in the art given the benefits described herein. What is necessary, however, is that the second level transistor 52 be adjoined with the first level transistor 14 by a single, mutual gate conductor 20. Further, electrical separation between gate conductor 20 and the transistor pairs formed by that conductor is advantageously achieved by respective gate dielectrics. Those gate dielectrics can, in both instances, be formed by a highly desirable thermal oxidation process. Thermal oxidation needed to form the gate dielectric of the second transistor 52 formation is readily achieved using the pre-existing opening and simply operating within the confines of that opening. The opening provides fine-line peripheral resolution of the grown and/or deposited dielectric materials.

Given the present description, it is readily apparent that the process sequence set forth in FIGS. 1 through 8 can be repeated to possibly produce numerous levels of active and passive devices. Thus, three or more levels of stacked transistors can be produced. If four levels are required, then two sets of transistor pairs with common gate conductors can be formed. It is further understood that each level can retain more than one transistor arranged substantially lateral and along the same horizontal plane to one another. Therefore, the present methodology encompasses multi-level active and passive devices arranged in three dimensions.

According to one embodiment, first transistor 14 comprises an n-channel transistor having an n-type gate conductor. In this scenario, second transistor 52 comprises a p-channel transistor. According to an alternative embodiment, first transistor 14 comprises a p-channel transistor and second transistor 52 comprises an n-channel transistor. In the latter scenario, gate conductor 20 is doped p-type. In order to render substrate 10 and substrate 42*b* semiconductive, the respective substrates are doped opposite the source/drain junctions formed therein. Alternatively, both transistors 14 and 52 can be of the same type (i.e., both are n-channel or p-channel transistors), if desired.

Various modifications and changes made be made to each and every processing step without departing from the spirit and scope of the invention provided the interconnect concepts set forth in the claims are retained. It is intended that the following claims be interpreted to embrace all such modifications and changes, and accordingly, the specification and drawings are to be regarded in an illustrative rather than a restrictive sense.

What is claimed is:

1. A method for interconnecting a pair of transistors, comprising:

providing a first transistor having a gate conductor;

depositing an interlevel dielectric across said gate conductor;

forming an opening through said interlevel dielectric to said gate conductor;

forming a gate dielectric upon said gate conductor within the confines of said opening;

filling said opening with a substrate; and implanting source and drain regions into said substrate to form a second transistor.

2. The method as recited in claim 1, wherein said gate conductor is dielectrically formed upon a first topography.

3. The method as recited in claim 2, wherein said providing comprises doping said first topography with a first implant species on opposite sides of said gate conductor prior to said depositing the interlevel dielectric.

4. The method as recited in claim 3, wherein said implant source and drain regions comprises doping said source and drain regions with a second implant species of opposite impurity type than said first implant species.

5. The method as recited in claim 1, wherein said forming the opening comprises anisotropically etching through said interlevel dielectric.

6. The method as recited in claim 1, wherein said forming the gate dielectric comprises thermally growing an oxide.

7. The method as recited in claim 1, wherein said forming the gate dielectric comprises depositing an oxide containing nitrogen.

8. The method as recited in claim 1, wherein said substrate comprises polysilicon.

9. The method as recited in claim 1, wherein said implanting comprises:

patterning an implant masking material upon said substrate having an area constrained near the center of said substrate; and inserting an implant species into said substrate in areas void of said implant masking material.

10. A method for forming a single gate conductor shared by a pair of transistors, comprising:

implanting a first topography with a first implant species to produce first source and drain regions on opposite sides of a gate conductor to result in a first transistor;

depositing an interlevel dielectric upon said gate conductor;

removing said interlevel dielectric along an axis which extends substantially perpendicular to an upper surface of said gate conductor to form an opening to said upper surface;

filling said opening with a substrate;

implanting said substrate with a second implant species to produce second source an drain regions within said substrate approximately on opposite sides of said gate conductor to result in a second transistor.

11. The method as recited in claim 10, wherein said gate conductor is shared by said first and second transistors.

12. The method as recited in claim 10, wherein said implanting the substrate comprises patterning an implant masking material upon said substrate having an area constrained near the center of said substrate.

13. The method as recited in claim 12, wherein said implant masking material is constrained directly above said gate conductor.

14. The method as recited in claim 10, wherein said second implant species is of opposite impurity type than said first implant species.

* * * * *